United States Patent [19]

Cideciyan

[11] Patent Number: 5,245,339
[45] Date of Patent: Sep. 14, 1993

[54] FLEXIBLE ENCODING METHOD AND ARCHITECTURE FOR HIGH SPEED DATA TRANSMISSION AND STORAGE

[75] Inventor: Roy D. Cideciyan, Thalwil, Switzerland

[73] Assignee: International Business Machines Corporation, Armonk, N.Y.

[21] Appl. No.: 838,614

[22] Filed: Feb. 19, 1992

[30] Foreign Application Priority Data

Oct. 14, 1991 [EP] European Pat. Off. ........... 91810790

[51] Int. Cl.$^5$ .............................................. H03M 7/00
[52] U.S. Cl. ....................................... 341/95; 341/106
[58] Field of Search ..................... 341/50, 55, 59, 95, 341/106

[56] References Cited

U.S. PATENT DOCUMENTS

| | | | |
|---|---|---|---|
| 3,821,711 | 6/1974 | Elam et al. | 341/51 |
| 4,463,344 | 7/1984 | Adler et al. | 341/59 |
| 4,486,739 | 12/1984 | Franaszek et al. | 341/59 |
| 4,488,142 | 12/1984 | Franaszek | 341/59 |
| 5,016,258 | 5/1991 | Tanaka et al. | 375/25 |
| 5,140,474 | 8/1992 | Kahlman et al. | 560/40 |

FOREIGN PATENT DOCUMENTS

| | | |
|---|---|---|
| 0097763 | 1/1984 | European Pat. Off. . |
| 0123563 | 10/1984 | European Pat. Off. . |
| 0143553 | 6/1985 | European Pat. Off. . |
| 0250049 | 12/1987 | European Pat. Off. . |
| 0275585 | 7/1988 | European Pat. Off. . |
| 3608357 | 9/1987 | Fed. Rep. of Germany . |

OTHER PUBLICATIONS

Int. Journal of Electronics, vol. 67, No. 3, Sep. 1989, pp. 365-376.
Int. Journal of Electronics, vol. 27, No. 5, Sep. 1983, pp. 440-451.
IEEE Trans. on Circuits & Systems, vol. 38, No. 5, May 1991, pp. 465-475.
IBM Journal of Res. & Dev., vol. 27, No. 5, Sep. 1983, pp. 440-451.

*Primary Examiner*—Marc S. Hoff
*Attorney, Agent, or Firm*—Joscelyn G. Cockburn

[57] ABSTRACT

In data transmission and storage using encoding through finite-state machines, the feedback link that updates each finite-state machine after each encoding step presents a bottleneck for a high speed implementation. The invention solves this problem for a class of finite-state machines that includes the encoder for the known 8B/10B Widmer-Franaszek code. The architecture consists of parallel finite-state units that are pipelined to run at a relatively low clock frequency. State updating is broken down into a feedforward part and a feedback part. In the feedback part, the state of each unit can be updated with a single operation. This allows efficient implementation of the finite-state encoder for practically any data rate just by appropriate pipelining and parallel processing.

15 Claims, 7 Drawing Sheets

FLEXIBLE ENCODING METHOD AND ARCHITECTURE FOR HIGH SPEED DATA TRANSMISSION AND STORAGE

FIELD OF THE INVENTION

This invention concerns the encoding of data strings, here sequential data bytes into code words of different length, for high speed data communication or storage purposes. For many applications, the encoding of k-bit data bytes into m-symbol code words, using finite-state encoders is a preferred method. Several special codes have been developed for that purpose, one of them is the 8B/10B Widmer-Franaszek code, described in U.S. Pat. No. 4,486,739. This code interleaves bytes of a 3B/4B code with bytes of a 5B/6B code. The encoder for the Widmer-Franaszek code always includes a finite-state machine.

The invention is also directed to an encoder architecture that allows easy adaptation to given input data speeds, particularly in the Gigabit-per-second area.

Further, the invention pertains to an encoder architecture allowing imple- mentation in VLSI, i.e. very large scale integration in semiconductor technology.

BACKGROUND

In data communication as in storage applications, encoding of an incoming data byte stream into an equivalent stream of code words is often performed for reasons of better use of the transmission channel, facilitating receiver operations, safer transmission or storage, better recognition of noisy transmitted or stored data, lower failure rate under difficult conditions, etc. At very high data speeds, e.g. in the Gigabit-per-second area, it becomes difficult to encode the incoming data byte stream fast enough, even more so when complex encoding methods or schemes are being used. One of the preferred encoding methods includes the use of finite-state encoders that have to be state-updated after each encoding step. If such finite-state encoders are arranged in parallel to adapt them to high data rates in a pipelining fashion, the state-updating still occurs sequentially, thus often requiring more time than available. Of course, this slows down the maximum transmission speed achievable with such a device.

European Patent Application 90810614.9, filed Aug. 16, 1990, not yet published, shows one approach to solve the problem indicated above and persons skilled in the art may derive useful background information and some details for understanding the present invention. In the prior application, an encoder principle is disclosed which allows pipelined as well as seemingly parallel operation of the encoder. Several finite-state coder units are physically arranged in parallel, however, the respective coder state updating bits are actually not simultaneously available, but propagate from section to section similar to a carry-over function. Though this propagation may happen within one clock cycle, it certainly determines the minimum length of such clock cycle and thus limits the achievable speed for processing incoming data strings.

General methods introducing concurrency to improve the throughput at the expense of latency are described by H.-D. Lin and D.G. Messerschmitt in "Finite State Machine has Unlimited Concurrency", published in the IEEE Transactions on Circuits and Systems, Vol. 38, No. 5, May 1991. The methods described there are, however, of very general and more theoretical nature and do not teach or address how to efficiently generate concurrency in a given specific application.

OBJECTS OF THE INVENTION

Main object of the invention is to provide an encoding method and architecture that allows real-time high speed processing of incoming data strings.

A further object is to devise an encoding technique and architecture that allows adaptation to and operation at practically any data input rate.

Also an object is to provide an encoding architecture that allows easy implementation in VLSI technology to further increase the achievable speed limit of the incoming data.

SUMMARY OF THE INVENTION

These and other objects are achieved by the invented method for encoding k-bit data bytes into m-symbol code words using parallel encoding units including finite-state coders and a coding procedure with at least two states. The output symbols are to be chosen from an M-ary alphabet.

In a nutshell, a state transition function $z(n+1)=g(x(n),z(n))$, in which $x(n)$ is the current input data byte and $z(n)$ the current state of the coder, determines the state updating of each coder and an output function $y(n)=h(x(n),z(n))$, in which $y(n)$ is the current output code word, determines the output of each coder. The state transition function of a coder is selected such that the next state can be expressed as $z(n+1)=g(x(n),z(n))=p(n)\bigcirc z(n)$. The function $p(n)=f(x(n))$ is obtained solely from the input $x(n)$. It can be (and is) obtained by preprocessing in a prior time interval. If the operation denoted by the algebraic operator "$\bigcirc$" is associative, those coders that are arranged in parallel can now be switched, i.e. their state updated, simultaneously in the current time interval.

Compared with the teaching given in above mentioned prior European Patent Application 90810614.9, in the present invention, those coders that are arranged in parallel actually may have the respective coder state bits available simultaneously—without any necessary propagation—at their respective state switching entries, enabling all parallel coders to switch to their new states simultaneously. This is achieved by appropriate selection of the functions as defined in the method claims.

An appropriate architecture is given in the apparatus claims; the necessary background information and a number of embodiments, including a preferred embodiment, are described in the following with reference to the drawings.

THE DRAWINGS

The appended drawings show in

FIG. 1 the power spectral density of the Widmer-Franaszek code,

FIG. 2 a block diagram of a finite-state machine used in the invention,

FIG. 3 a block diagram of finite-state machines operating in parallel,

FIG. 4 the state updating of the parallel finite-state machines,

FIG. 5 an encoder architecture for the Widmer-Franaszek 8B/10B code,

FIG. 6 an encoder architecture consisting of a number of N identical encoding units, FIG. 7 a random logic implementation of one encoding unit according to FIG. 6.

GENERAL INTRODUCTION

In the following, a more general introduction for an implementation of the invention is given. The implementation itself, described further down, is based on the well-known 8B/10B Widmer-Franaszek code already mentioned above. However, it should be pointed out that the invention is not solely applicable to this code, but has a much wider scope, as will be apparent from the discussion below.

The 8B/10B Widmer-Franaszek (WF) code, mapping 8-bit bytes into 10-bit codewords, has found wide use within the industry owing to an excellent balance between good code parameters, low redundancy and simple implementation based on sequential logic. It is disclosed, e.g., in A. Widmer and P. Franaszek, "A DC-Balanced, Partitioned-Block, 8B/10B Transmission Code", IBM Journal of Research and Development, Vol. 27, No. 5, September 1983, pp. 440–451, and in U.S. Pat. No. 4,486,739, issued in December 1984.

The WF code imposes various signal characteristics at the output of the transmitter that are needed for data transmission over metallic cables and optical fibers. The most significant feature of the WF code is its suppression of power around the zero frequency, i.e., the code spectrum exhibits a null at DC and negligible low-frequency signal power. FIG. 1 shows the power spectral density of the WF code that has been computed using the matrix methods described by G.L. Cariolaro and G.P. Tronca in "Spectra of Block Coded Digital Signals", published in IEEE Trans. Commun., Vol. COM-22, October 1974, pp. 1555–1564.

The spectral properties of the encoded data stream allow the filtering of low-frequency noise and the use of AC-coupled receivers to achieve high sensitivity in the presence of device parameter drift and temperature variation. Furthermore, the encoded data stream has large transition density and small maximum runlength of identical symbols to facilitate clock extraction. Finally, the code provides control words for signaling and sync words for synchronization.

There are several different code parameters associated with the WF code. The spectral properties of the encoded data around DC depend to a large extent on a single parameter, the digital sum variation (DSV). It is well known that the finite DSV condition in the time domain is equivalent to a spectral null at DC in the frequency domain as described by G. Pierobon in "Codes for Zero Spectral Density at Zero Frequency", published in IEEE Trans. Inform. Theory, Vol. IT-30, March 1984, pp. 425–429.

Furthermore, the smaller the DSV, the smaller is the signal power at low frequencies around DC. The DSV associated with the WF code is six, implying that the running digital sum at any time instant is one of seven consecutive integers and the runlength of identical symbols is at most six. The construction of the WF code, however, guarantees that the maximum runlength of identical symbols is five. Other parameters of interest for the timing recovery are a minimum and average transition density of 30% and 60%, respectively. Finally, the WF code provides 12 additional special words that satisfy all the desired code constraints and can be used for synchronization and signalling control functions.

The Enterprise Systems Connection (ESCON) architecture of the IBM System/390 uses 200 MBaud serial fiber-optic links to interconnect processors, disk and tape storage, and control units. The transmission code that is used for ESCON channels is the WF code. Recently, the American National Standards Institute ASC X3T9.3 Committee selected the WF code as the transmission code for the Fiber Channel where the data rates of interest are 200 Mbit/sec and 800 Mbit/sec. Currently, standardization committees are considering fiber-optic links that will operate at line rates exceeding 1 GBaud. These developments have generated interest in the implementation of the WF code at several GBaud line rates. The decoder for the WF code is a block decoder that performs memory-less mapping of 10-bit code words into 8-bit bytes and can therefore be implemented at any data rate by the use of pipelining and parallel processing. The encoder for the WF code can be viewed as a 2-state machine, mapping 8-bit bytes into 10-bit code words, depending on the current value of the state of the machine.

The implementation of the WF code given by A. Widmer and P. Franaszek (cf., as mentioned above, "A DC-Balanced, Partitioned-Block, 8B/10B Transmission Code", IBM Journal of Research and Development, Vol. 27, No. 5, September 1983, pp. 440–451, and in U.S. Pat. No. 4,486,739, issued in December 1984) exploits the partitioned-block nature of the code and requires that gate delays are no more than one symbol interval. This encoder realization has been tested at a line rate of 200 MBaud using emitter coupled logic (ECL) technology. For a line rate of k GBaud, the maximum gate delay that can be tolerated in the encoding circuitry given by Widmer and Franaszek is 1/k nanoseconds. Thus, for a line rate of 5 GBaud, the resulting maximum gate delay is 0.2 ns and the encoder realization becomes a formidable task.

Recently, codes have been constructed that have better parameters than the WF code and can be implemented at high data rates. One example is disclosed in the already mentioned European Patent Application 90810614.9. The encoder realization given there, however, does not allow arbitrarily high data rates because the clock rate of the encoder sets an upper limit on the number of parallel units that can be used. Furthermore, for N simultaneously processed bytes, a table lookup implementation of the encoder for the WF code that is based on the architecture according to the present invention would require only 512N one-bit memory cells, as opposed to 10240N one-bit memory cells that are needed for a table lookup implementation of the encoders according to European Patent Application 90810614.9. This translates into 95% saving in memory. The high speed implementation of the encoder for the WF code with random logic will be discussed further down.

Generally speaking, in each implementation using finite-state machines, the state-updating (of each finite-state machine) requires a feedback link that is the bottleneck for a high speed implementation.

The present invention solves this problem by a flexible encoder architecture for a class of finite-state machines, including the encoder for the WF code. In brief, the architecture consists of pipelined parallel units that run at a low clock frequency. State updating is broken down into a feedforward part and a feedback part. In the feedback part, the state of each parallel unit can be updated with a single operation. In other words, the delay in the critical feedback path can be made independent of the number of parallel units and reduced the time needed to perform a single operation. This eliminates the technology-dependent upper limit on achievable encoder throughput or data input rates and allows the implementation of the finite-state encoder at any data rate using appropriate pipelining and parallel processing.

A further advantage of an architecture according to the present invention is that it is suitable to be implemented in very large scale (VLSI) semiconductor technology. Architectures that are favoured for VLSI provide local communication with minimal amount of global communication, large degree of regularity for reducing design cost and time, high efficiency (small chip area) and linearity between hardware complexity and data rate.

The flexible encoder architecture according to the invention exhibits, particularly for the WF code, all these properties and is therefore well suited to VLSI implementation. In addition to allowing arbitrarily high data rates, the parallel processing in the new architecture permits the fabrication of the encoder and the decoder in low speed CMOS technology. Only the serializer following the encoder and the deserializer preceding the decoder need to be implemented in a faster and more costly technology such as bipolar semiconductor or GaAs technology.

The disclosed parallel implementation of an encoder/decoder for the WF code consisting of N identical units exhibits a large degree of regularity and is therefore well suited to VLSI implementation. Furthermore, its realization is very efficient in terms of chip area. Assuming a clock frequency of 60 MHz and a 4-byte interface (N=4), a 240 Mbyte/s encoder/decoder operates at a line rate of 2.4 GBaud and its implementation in CMOS technology requires about 2000 gates. This results in about 90% saving in chip area when compared to a table-lookup realization of a 2.4 GBaud encoder/decoder in CMOS technology, as disclosed e.g. in European Patent Application 90810614.9, mentioned above.

DETAILED DESCRIPTION

In this section, a flexible encoder architecture for a class of finite-state machines that is well suited to high speed implementation is proposed. A finite-state machine with state space F can be described by two functions g and h that map the input $x(n)$ and the current state $z(n) \epsilon F$ into the next state $z(n+1)=g(x(n),z(n))\epsilon F$ and the output $y(n)=h(x(n),z(n))$.

Figure 1:
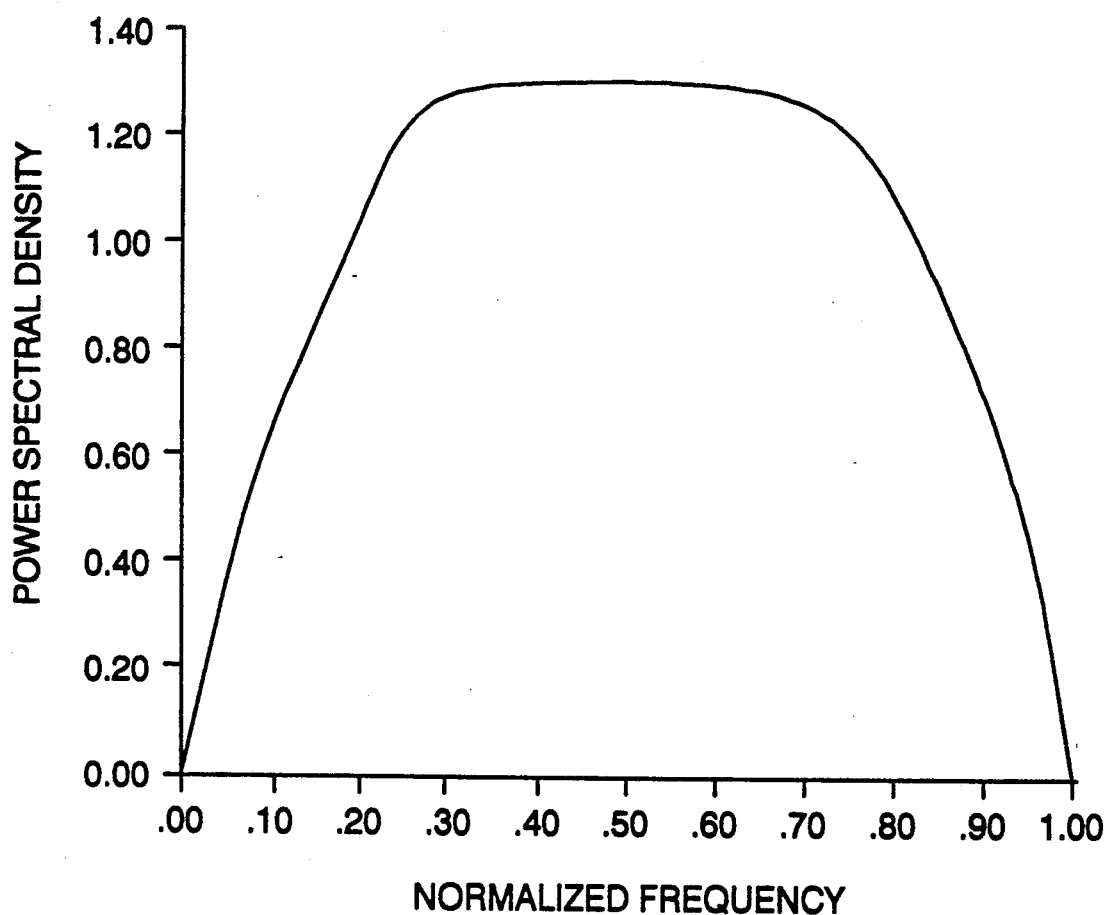
Figure 2:
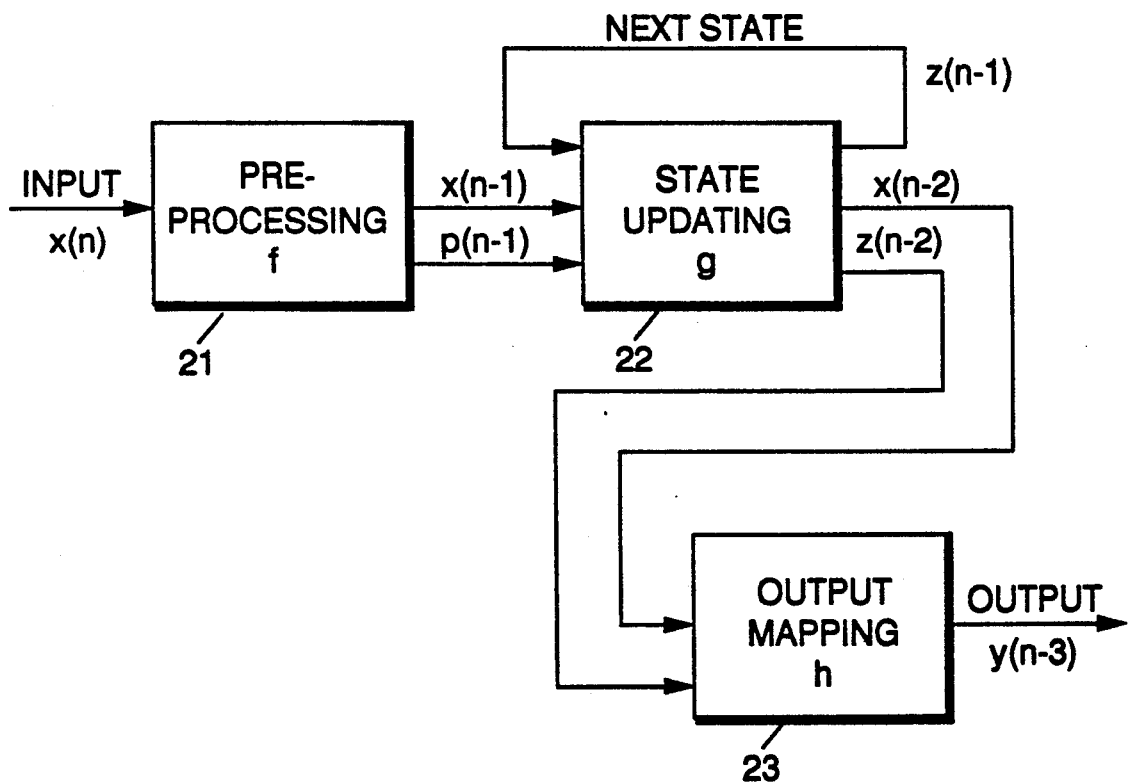

The block diagram of a finite-state machine is shown in FIG. 2. In general, preprocessing is not needed to implement a finite-state machine. However, according to the invention, for some classes of finite-state machines, preprocessing is useful in achieving high throughput rates. In FIG. 2, it has been assumed without loss of generality that preprocessing, state updating and output mapping can be each performed within one clock cycle by a preprocessor 21, an updating member 22, and an output mapper 23, respectively. In general, these three operations can extend over several clock cycles and overlap with each other. This occurs, for example, in the particular realization of the encoder for the WF code that will be discussed further down.

The class of finite-state machines considered here has the property that their next state can be expressed as $z(n+1)=g(x(n))=p(n) \odot z(n)$ where $p(n)=f(x(n)) \epsilon F$ is obtained from the input $x(n)$ by preprocessing and the algebraic operation denoted by "$\odot$" is associative, i.e., $a \odot (b \odot c)=(a \odot b) \odot c$ for $a,b,c \epsilon F$. Note that the preprocessor 21 and the output mapper 23 in FIG. 2 are of the feedforward type, whereas the state updating member 22, containing the critical feedback link, is of the feedback type.

High speed encoder realizations that are based on parallel operating finite-state machines can be obtained if the current state of the i-th machine can be derived from the input and the current state of the (i−1)-th machine. The current state of the first machine is obtained from the previous input and state of the L-th machine.

Figure 3:
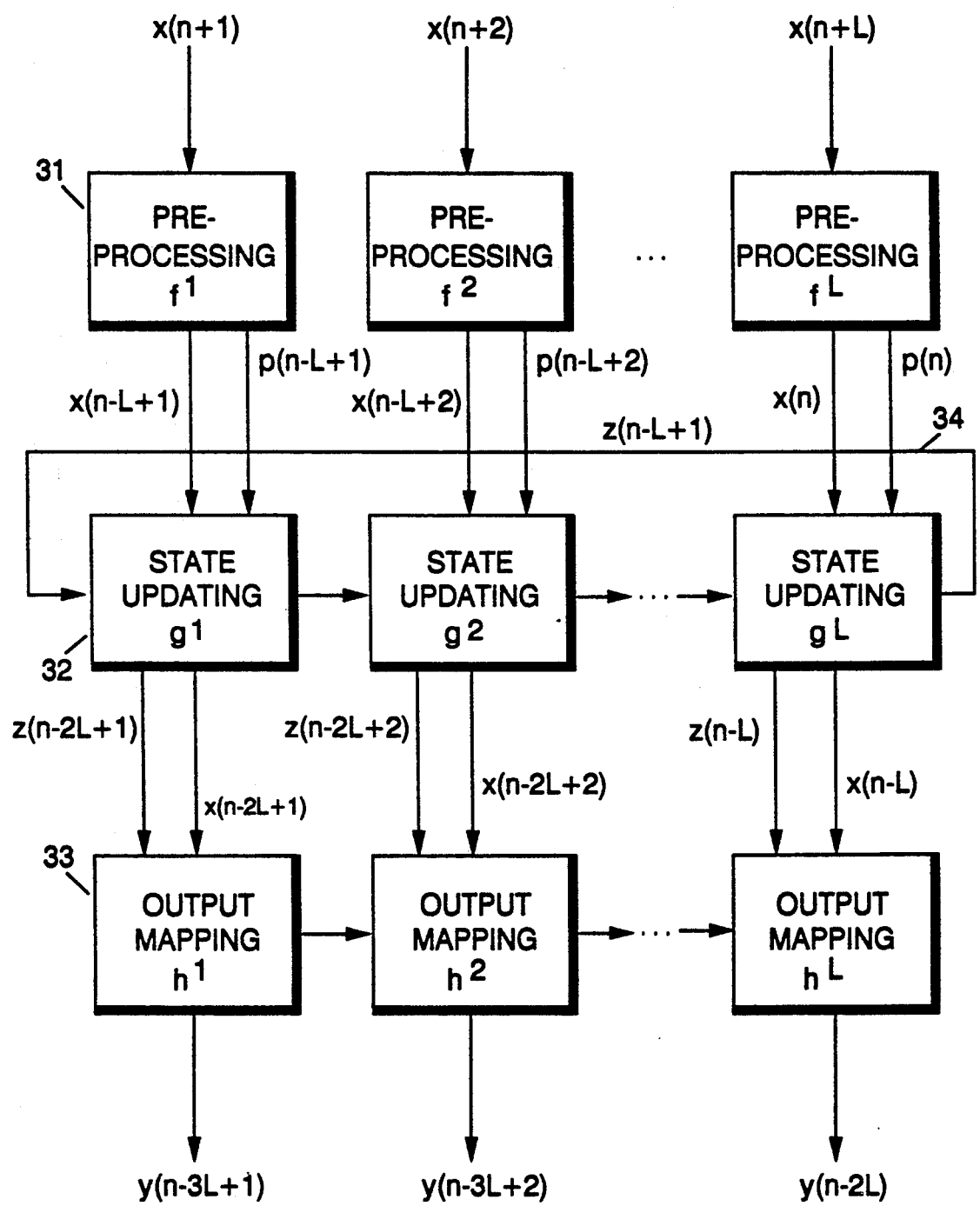

The block diagram of such a configuration consisting of L machines is shown in FIG. 3. Each of the parallel machines includes a preprocessor 31, a state updating member 32, and an output mapper 33. Note that the i-th finite-state machine is characterized by the functions $g^i$ and $h^i$, i=1,2, ..., L where the next state function $g^i$ of finite-state machines that are of interest to us is described by the algebraic operation $\odot$ and the function $f^i$. Furthermore, the output function $h^i$, i=2,3, ..., L can also depend on the input and the current state of the (i−1)-th machine. In general, all the L finite-state machines operating in parallel may be different from each other. As in FIG. 2, it has been assumed for the sake of simplicity that preprocessing, state updating and output mapping do not overlap in time and that each of them can be performed within one clock cycle.

State updating in the feedback link 34 of FIG. 3 usually requires at most L nested operations, e.g., $$z(n+L+1)=g^L(x(n+L),g^{L-1}(x(n+L-1),g^{L-2}(\ldots,g^2(x(n+2),g^1(x(n+1),z(n+1)))\ldots))).$$

For the class of finite-state machines that are considered here, at most L operations are needed to compute the state of a parallel machine. In this case, the updated states are given by $z(n+k)=p(n+k-1) \odot p(n+k-2) \odot \ldots \odot p(n+1) \odot z(n+1)$, k=2,3, ..., L+1. We now define the column vectors $\underline{Z}=(Z_2,Z_3,\ldots,Z_{L+1})$ and $\underline{P}=(P_1,P_2,\ldots,P_L)$ where $Z_k=z(n+k)$, k=1,2,..., L+1, and $P_k=p(n+k)$, k=1,2,..., L. State updating in FIG. 3 can be then expressed using the matrix-vector notation $\underline{Z}=G\underline{P}+\underline{1}Z$, where G is an L×L lower triangular all-one matrix and $\underline{1}$ is an all-one column vector. We define $\underline{R}=(R_1,R_2,\ldots,R_L) \triangleq G\underline{P}$, where $R_k=r(n+k)$, k=1,2, ..., L. The minimum delay needed for obtaining $\underline{Z}$ from $\underline{P}$ and $Z_1$ is $[\log_2(L+1)]$ delay units where $[x]$ is the smallest integer greater than or equal to x and a delay unit corresponds to the delay associated with obtaining $A \odot B$ from A and B.

Figure 4:
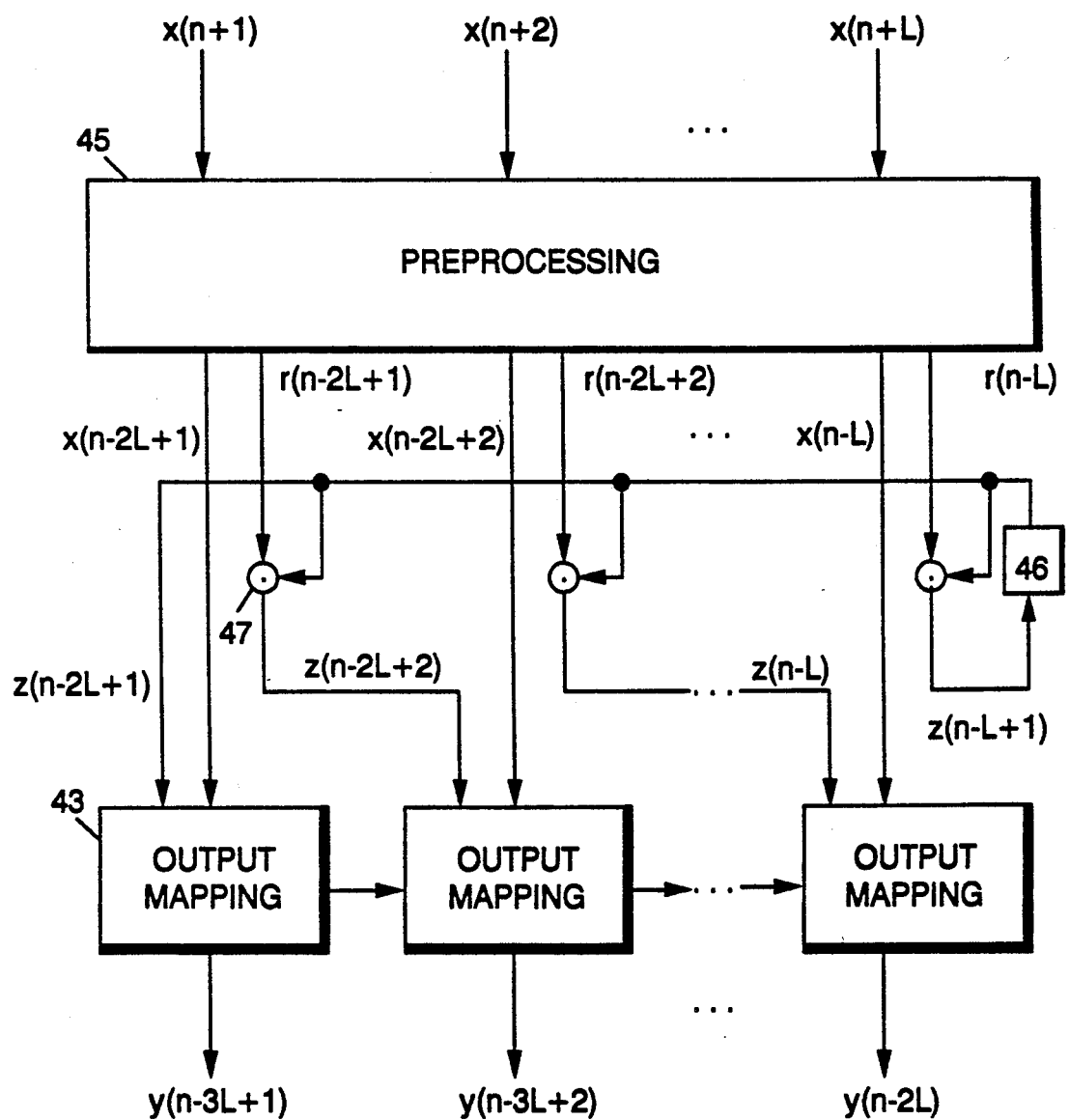

The states of the parallel coders in FIG. 3 can be updated according to the invention as shown in FIG. 4. Computation of next states is broken down into a feedforward part $\underline{R}=G\underline{P}$, that can be precomputed outside the feedback link in feedforward processor 45, and a feedback part $\underline{1}Z_1$ requiring a single operation, performed for each coder by algebraic operator member 47. Output mappers 43 (FIG. 4) serve the same purpose as output mappers 33 in FIG. 3, namely mapping the input data bytes into the output code words. A delay stage 46 is provided to hold the output of the last (rightmost) coder for a predetermined time, e.g. one clock cycle. Therefore, independent of what the total number of parallel coders is, the number of operations carried out in the critical feedback path can always be restricted to one. This allows the implementation of the finite-state encoder at any data rate using appropriate pipelining and parallel processing.

As one can see from the notation for the input data bytes and the output code words in FIG. 4, the same latency is assumed as in the design according to FIG. 3. This is, of course, a matter of design and thus determined by the designer, based on the speed requirements and the available technology for the implementation.

It is neither always desirable nor necessary to reduce the feedback link to a single operation since this may lead to unnecessary precomputation, which, in turn, leads to an increase in latency and in complexity due to an increase in the total number of pipeline stages needed to implement the encoder. The designer of the encoder can determine the maximum amount of computation that can be carried out within the feedback link from the clock period and the gate latencies or other delays. For this purpose, the matrix G is expressed as a product of two matrices $G_1$ and $G_2$, i.e., $G=G_2G_1$. The part $Q=(Q_1,Q_2,\ldots,Q_L)\triangleq G_1P$, where $Q_k=q(n+k)$, $k=1,2,\ldots,L$. can be then precomputed outside the feedback link and $G_2\underline{Q}+\underline{1Z}$, is computed within the feedback link. This results in a flexible encoder architecture where the splitting of G into $G_1$ and $G_2$ determines the delay in the critical feedback path.

There are two extreme cases corresponding to the minimum and maximum amount of computation in the feedback link. For $G_1=G$, the state of each parallel unit can be updated with only one operation in the feedback loop. For $G_2=G$, the delay in the feedback loop is between $[\log_2(L+1)]$ and L delay units. In the particular realization of the WF code discussed in the next section L is always an even number and G is split into $G_1$ and $G_2$ such that at most L/2 operations are carried out in the feedback loop. We note again that if state updating in this case is performed in parallel than the delay in the feedback loop can be further reduced to $[\log_2(L/2+1)]$ delay units.

Implementation for the 8B/10B Widmer-Franaszek Code

In the following, an implementation of the invention for the 8B/10B WF code shall be described.

The 8B/10B code is a partitioned-block code, mapping 8-bit bytes into 10-bit code words (M=2). A sequence of 10-bit code words can be obtained by interleaving 6-bit and 4-bit code words from a 5B/6B code and a 3B/4B code. The current state of the 5B/6B (3B/4B) code is the running digital sum achieved at the end of the previous 4-bit (6-bit) code word. Since the 8B/10B WF code is constructed such that the running digital sum at the end of the 6th bit and the 10th bit (end of a 10-bit code word) always assumes two values, both codes, the 5B/6B code and the 3B/4B code, can be realized as two-state machines. The next state of the 5B/6B two-state machine is given by $z(n)=f^1(x(n-1))\oplus z(n-1)$, where $x(n-1)$ is the first five bits of a byte, $z(n-1)$ is the current state corresponding to the running digital sum achieved at the end of the previous 4-bit code word and $\oplus$ is mod 2 addition identical with the associative operation XOR (Exclusive Or). The next state of the 3B/4B two-state machine $z(n+1)$ is determined by the last three bits of a byte, $x(n)$, and the current state $z(n)$ corresponding to the running digital sum achieved at the end of the previous 6-bit code word, i.e., $z(n+1)=f^2(x(n))\oplus z(n)$.

The proposed flexible encode architecture can be used to obtain a high speed realization of the encoder for the WF code. Let N be the number of bytes that are processed in parallel. Since each byte is processed by two two-state machines (5B/6B code and 3B/4B code) L in FIG. 3 is always an even number given by L=2N, and $f^i=f^k$, $g^i=g^k$, $h^i=h^k$, $1\leq i,k\leq L$ if and only if i and k are both even or both odd. Furthermore, $x(n+k)$ is the first five bits of a byte if k is odd or the last three bits of a byte if k is even and $y(n-3L+k)$ is the first six bits of a 10-bit code word if k is odd or the last four bits of a 10-bit code word if k is even. Finally, the matrix factorization of the lower triangular all one matrix in the finite field with two elements, where addition is a mod 2 addition and multiplication is a mod 2 multiplication, determines $G_1$ and $G_2$.

Figure 5:
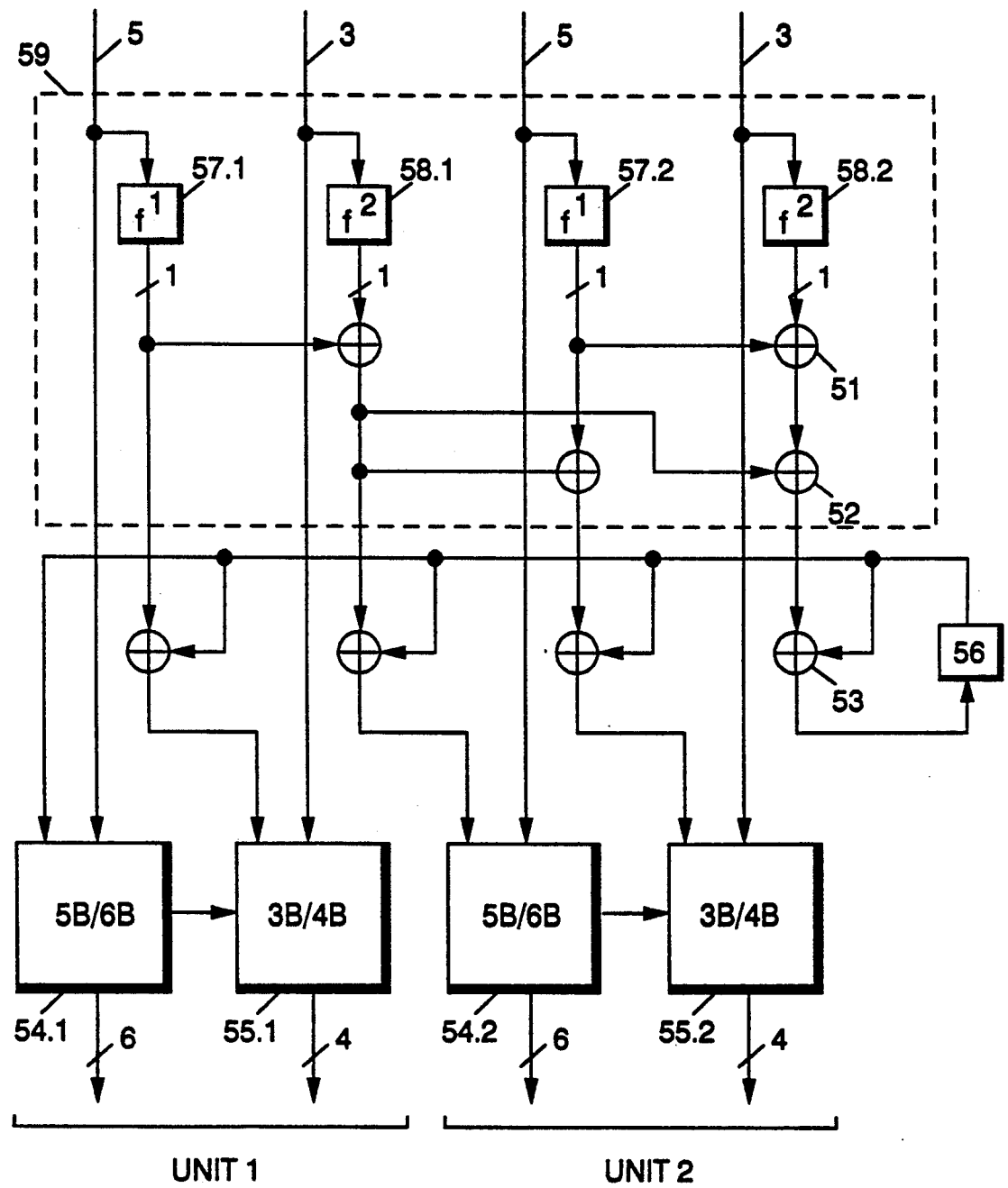

The block diagram of an encoder for the WF code, consisting of two encoding units (N=2), is shown in FIG. 5. Depending on speed requirements, more units than the two shown may be necessary. Each encoding unit includes a first output mapper 54 (of the 5B/6B coder) and a second output mapper 55 (of the 3B/4B coder). Preprocessors 57 and 58 perform the Boolean functions $f^1$ and $f^2$ and generate a bit indicating whether the current state and the next state will be identical or not. The first two rows of XOR gates 51 and 52 generate linear combinations of the preprocessor outputs $\underline{Q}$, corresponding to multiplying the preprocessor outputs $\underline{P}$ with the matrix G. The lowermost row of XOR gates 53 generates the updated states according to $GQ\oplus 1Z_1$ where $\oplus$ indicates component-wise mod 2 addition and $Z_1$ is the current state of the 5B/6B coder 54.1 in the leftmost encoding unit. Feedforward preprocessor 59 and delay stage 56 serve the same purpose as the feedforward preprocessor 45 and the delay stage 46 in FIG. 4, respectively.

Figure 6:
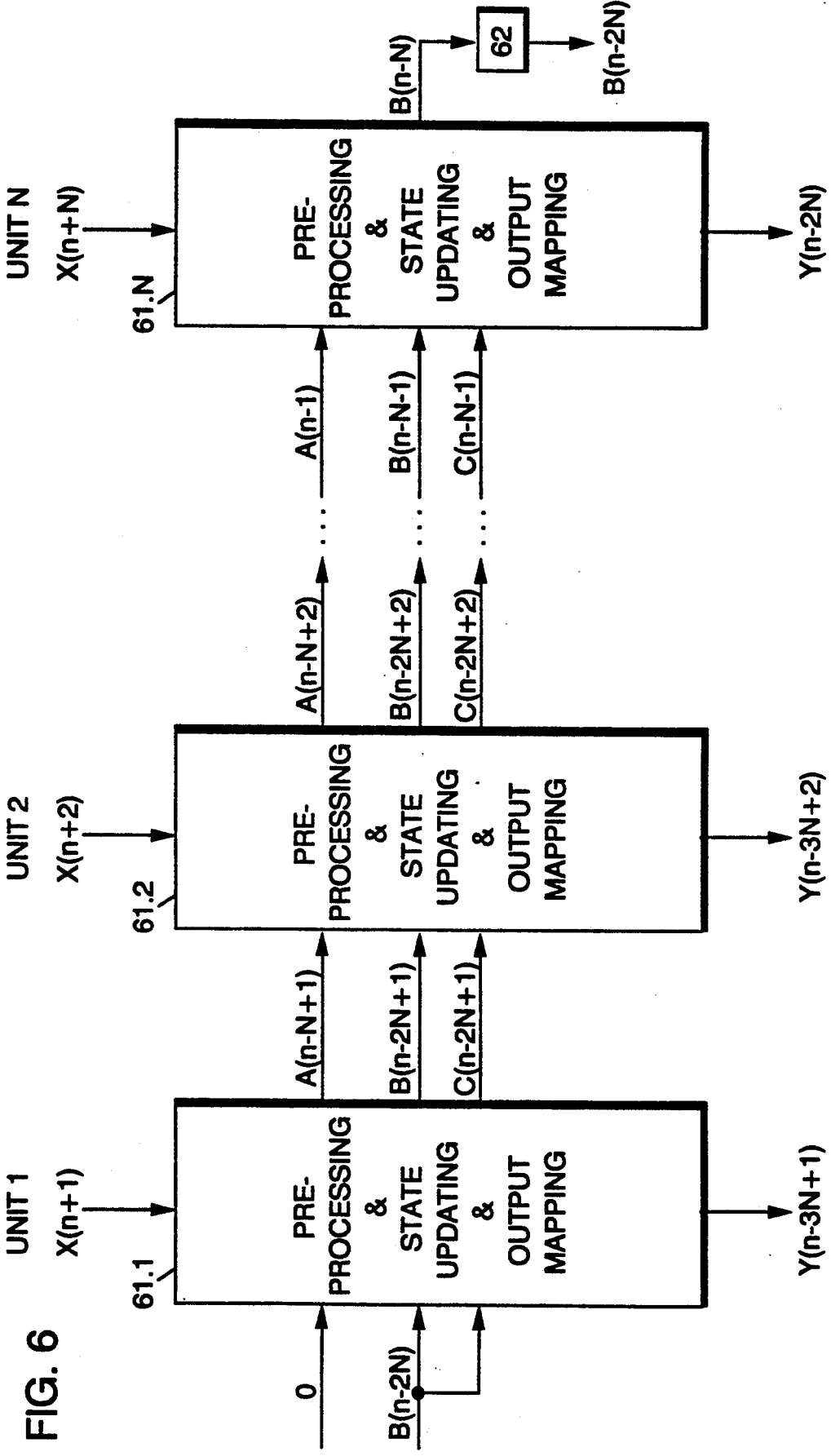

The particular implementation of the encoder for the WF code is shown in FIG. 6 and consists of N identical units 61.1 to 61.N processing N bytes in parallel. This has been achieved by selecting $G_1$ such that $q(n+1)=p(n+1)$ and $q(n+k)=p(n+k-1)\oplus p(n+k)$, $k=2,3,\ldots,L$. In FIG. 6, the incoming bytes and outgoing 10-bit code words are denoted by $X(n+k)$, $k=1,2,\ldots,N$ and by $Y(n-3N+k)$, $k=1,2,\ldots,N$, respectively. There are two modes of operation indicated by K, K=0 in the data mode and K=1 in the control mode. The intermediate variables $A(n-N+k)$, $B(n-2N+k)$, $C(n-2N+k)$, $k=1,2,\ldots,N-1$ are the outputs of unit k and at the same time the inputs of unit k+1. The output of unit 61.N, $B(n-N)$, corresponding to the next state of the 5B/6B two-state machine in unit 61.1 is fed back to unit 61.1 in the next clock cycle. Delay stage 62 serves the same purpose as delay stage 46 in FIG. 4.

Figure 7:
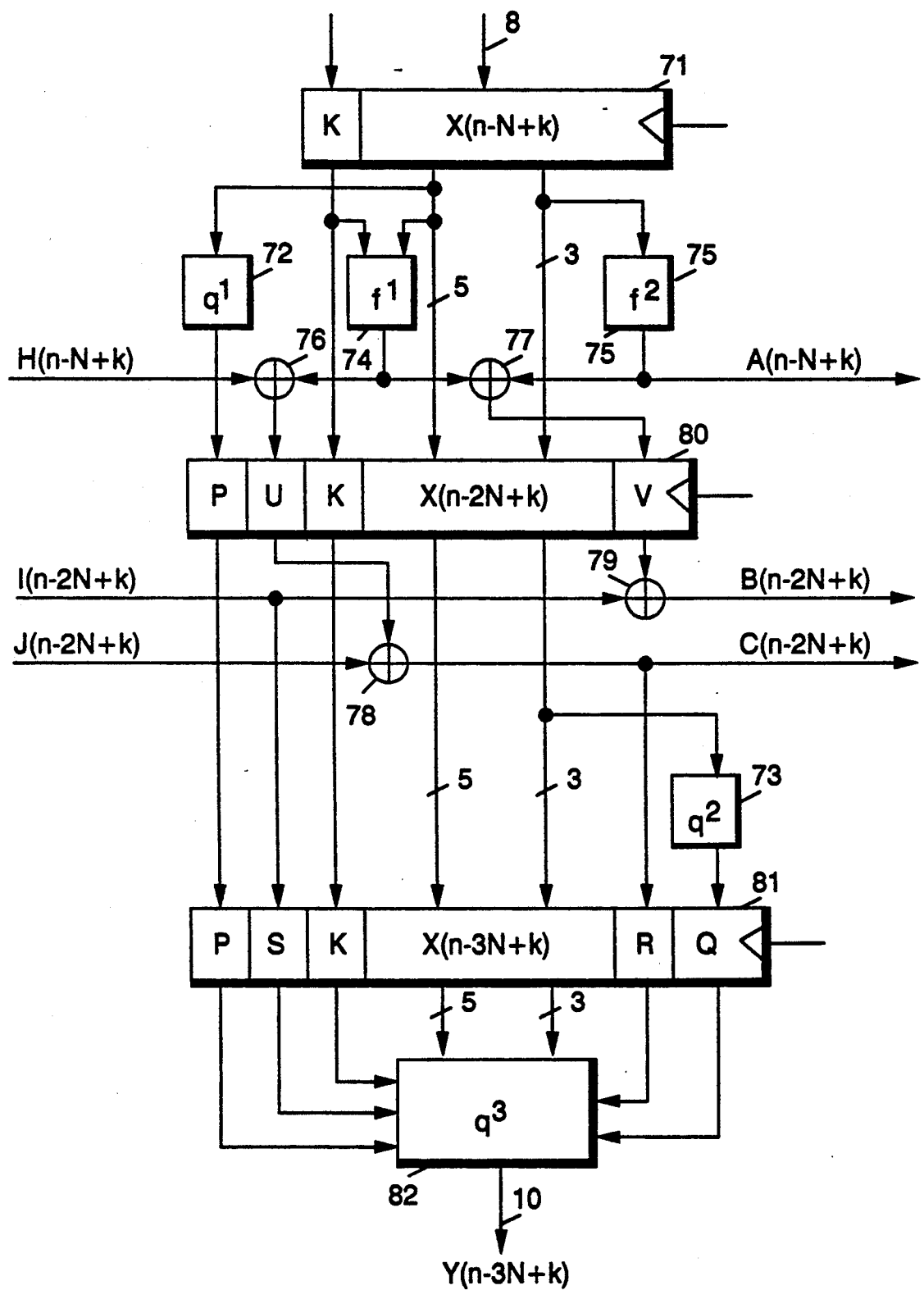

FIG. 7 depicts a random logic implementation of one of the units 61.1 to 61.N in FIG. 6. The implementation consists of three pipeline stages. In a first preprocessing step, the first pipeline stage generates with preprocessors 74 and 75 the values p(n) and the 5B/6B coder and the 3B/4B coder, respectively. The 5B/6B and 3B/4B coders are implemented in output mapping stage 82. State updating is performed via the four XOR gates 76, 77, 78, and 79 during the first and second pipeline stages. Output mapping is done during all three pipeline stages with the output mappers 72, 73 and 82. The input to each pipeline stage is stored in registers 71, 80, and 81.

The intermediate variables $H(n-N+k)$, $I(n-2N+k)$, $J(n-2N+k)$, $k=1,2,\ldots,N$ are the inputs of unit k. Note that $H(n-N+1)=0$ and $I(n-2N+1)=J(n-2N+1)=B(n-2N)$.

Furthermore, $H(n-N+k)=A(n-N+k-1)$, $I(n-2N+k)=B(n-2N+k-1)$, $J(n-2N+k)=C(n-2N+k-1)$, for $k=2,3,\ldots,N$.

The bits in the input byte and the output code word are denoted by $X_i$, $i=1,2,\ldots,8$, and $Y_i$, $i=1,2,\ldots,10$, respectively. The Boolean functions $f^i$, $i=1,2$, $q^i$, $i=1,2,3$, perform preprocessing and output mapping. They can be expressed as $T = W_1 + X_1X_2X_3X_4 + K$ $P = W_1 + X_1X_2X_3$ $A = \overline{X_6 + X_7} + X_6X_7X_8$ $U = H \oplus T$ $V = T \oplus A$ $B = I \oplus V$ $C = J \oplus U$ $Q = X_6 \oplus X_7$ $Y_1 = (P(\overline{S} \oplus (\overline{X_2 + X_3 + X_4}(X_1 + X_5) + X_2X_3X_4\overline{X}_1X_6)) + PX_1) \oplus W_2S$ $Y_2 = (P(\overline{S} \oplus (\overline{X_1 + X_3 + X_4 + X_5} + X_1X_3X_4X_5)) + \overline{P}X_2) \oplus W_2S$ $Y_3 = (P(\overline{S} \oplus (\overline{X_1}X_4X_5\overline{X_2X_3} + \overline{X_1 + X_2 + X_4 + X_5} + X_1X_2X_4X_3X_5)) + PX_3) \oplus W_2S$ $Y_4 = (P(\overline{S} \oplus (\overline{X_1 + X_2 + X_3}(X_4 + X_5) + X_1X_2X_3(\overline{X_4 + X_5}))) + \overline{P}X_4) \oplus W_2S$ $Y_5(P(\overline{S} \oplus (X_1 + X_2 + X_3)\overline{X_4 + X_5} + \overline{X_3X_4X_5})) + \overline{P}X_5) \oplus W_2S$ $Y_6 = (P(\overline{S} \oplus (X_1X_2X_3\overline{X_4} + X_1X_4X_5\overline{X_2X_3} + X_3X_4X_5\overline{X_1X_2})) + \overline{P}(X_1 \oplus X_2 \oplus X_3 \oplus X_4 \oplus X_5)) \oplus W_2\overline{S}$ $Y_7 = (QK(\overline{R} \oplus X_6) + Q\overline{K}X_6 + \overline{Q}(R \oplus (X_7X_8))) \oplus \overline{W}_3$ $Y_8 = QK(\overline{R} \oplus X_7) + Q\overline{K}X_7 + \overline{Q}(R \oplus (X_7X_8))$ $Y_9 = QK(\overline{R} \oplus X_8) + Q\overline{K}X_8 + \overline{Q}(R \oplus X_7X_8)$ $Y_{10} = (QK(\overline{R} \oplus \overline{X_8}) + Q\overline{K}\overline{X_8} + \overline{Q}(R \oplus (X_7X_8))) \oplus \overline{W}_3$ where overbar stands for Boolean inversion, and AB, $A+B$, $A \oplus B$ denote the Boolean operations A AND B, A OR B, A XOR B, respectively. The intermediate variables $W_i$, $i=1,2,3$, are given by $W_1 = \overline{X_1 + X_2 + X_3} + X_1X_2X_5(X_3 + X_4) + \overline{X_1X_2 + X_3 + X_4 + X_5} + X_3X_4X_5(X_1 + X_2) + \overline{X_1 + X_2 + X_5 + X_3 \cdot X_4}$ $W_2 = K\overline{X_1X_2X_3X_4X_5}$ $W_3 = X_4\overline{X_5}S(X_1X_2\overline{X_3} + X_1\overline{X_2}X_3 + \overline{X_1}X_2X_3) + \overline{X_4}X_5\overline{S}(X_1\overline{X_2X_3} + \overline{X_1}X_2\overline{X_3} + \overline{X_1X_2}X_3) + \overline{X_6X_7}X_8 + K$ An appropriate decoder (not shown) consists of N identical independent units and processes N bytes in parallel. It is a block decoder with limited error propagation where the mapping of code words $Y_i$, $i=1,2,\ldots,10$, into bytes $X_i$, $i=1,2,\ldots,8$, is memory-less. Errors in a 10-bit code word give rise to at most one erroneous byte. The random logic implementation of unit k has been obtained based on Table 6 and Table 7 in the already mentioned paper by Widmer and Franaszek in the IBM Journal of Research and Development. The Boolean equations are given by $E_1 = \overline{Y_1 \oplus Y_2 \oplus Y_3 \oplus Y_4}(Y_1 + Y_2 + Y_3 + \overline{Y_4})\overline{Y_1Y_2Y_3Y_4}$ $E_2 = (Y_1 \oplus Y_2 \oplus Y_3 \oplus Y_4)\overline{Y_1Y_2 + Y_3Y_4}$ $E_3 = (Y_1 \oplus Y_2 \oplus Y_3 \oplus Y_4)(Y_1Y_2 + Y_3Y_4)$ $E_4 = E_1Y_2Y_3\overline{Y_5 \oplus Y_6} + E_3Y_6$ $E_5 = E_1\overline{Y_2 + Y_3}\overline{Y_5 \oplus Y_6} + E_3Y_6$ $E_6 = E_1\overline{Y_2 + Y_3}\overline{Y_5 \oplus Y_6} + E_2\overline{Y_6}$ $E_7 = E_2Y_4Y_5Y_6 + E_2\overline{Y_5} + \overline{Y_3 + Y_4} + \overline{Y_5 + Y_6}$ $E_8 = E_1Y_1Y_3\overline{Y_5 \oplus Y_6} + Y_1Y_2Y_5Y_6$ $E_9 = E_1\overline{Y_1 + Y_3Y_5 \oplus Y_6} + \overline{Y_1 + Y_2 + Y_5 + Y_6}$ $E_{10} = E_1\overline{Y_1 + Y_3Y_5 \oplus Y_6} + Y_1Y_2Y_5Y_6$ $E_{11} = \overline{Y_3 + Y_4 + Y_5 + Y_6}(Y_9 \oplus Y_{10}) + \overline{Y_7 + Y_8}Y_9Y_{10} + Y_7Y_8Y_{10} + \overline{Y_7 + Y_8 + Y_9}$ $X_1 = Y_1 \oplus (E_5 + E_7 + E_{10})$ $X_2 = Y_2 \oplus (E_4 + E_7E_8)$ $X_3 = Y_3 \oplus (E_4 + E_7 + Y_9)$ $X_4 = Y_4 \oplus (E_5 + E_7 + E_8)$ $X_5 = Y_5 \oplus (E_6 + E_7 + E_9)$ $X_6 = Y_7 \oplus (Y_7Y_9Y_{10} + E_{11} + Y_8Y_9Y_{10})$ $X_7 = Y_8 \oplus (\overline{Y_7 + Y_9 + Y_{10}} + E_{11} + \overline{Y_8 + Y_9 + Y_{10}})$ $X_8 = Y_9 \oplus (Y_7Y_9Y_{10} + E_{11} + \overline{Y_8 + Y_9 + Y_{10}})$ $K = Y_3Y_4Y_5Y_6 + \overline{Y_3 + Y_4 + Y_5 + Y_6} + E_2\overline{Y_5}Y_6Y_8Y_9Y_{10} + E_3\overline{Y_6}Y_5\overline{Y_8 + Y_9 + Y_{10}}$ where $E_i$, $i=1,2,\ldots,11$, are intermediate variables $X_i$, $i=1,2,\ldots,8$, is the input byte and K indicates whether the received byte represents data or control information.

I claim:

1. Method for encoding k-bit data bytes into m-symbol code words using parallel encoding units including finite-state coders and a coding procedure with at least two states, wherein each coder's state updating is determined by a state transition function $z(n+1) = g(x(n), z(n))$, in which $x(n)$ is the current input data byte and $z(n)$ the current state of the coder, and each coder's output is determined by an output function $y(n) = h(x(n), z(n))$, in which $y(n)$ is the current output code word, characterized in that the state transition function is selected such that a next state can be expressed as $z(n+1) = g(x(n), z(n)) = p(n) \odot z(n)$, in which $p(n) = f(x(n))$ is obtained solely from the input $x(n)$ and the operation denoted by the algebraic operator "$\odot$" is associative, that the variable p(n) is obtained for each coder by preprocessing in a time interval prior to the current time interval, that an algebraic operation combines variables p(n) of at least two coders, and that the states of at least two parallel coders are updated simultaneously.

2. Encoding method according to claim 1, wherein the states of all coders in said parallel encoding units are updated simultaneously in a single operation.

3. Encoding method according to claim 1 or 2, wherein said variables p(n) are obtained in a first preprocessing step prior to the current time interval, said variables p(n) are algebraically combined in a second preprocessing step prior to the current time interval, and said updating of the states of said parallel coders occurs during the current time interval.

4. Encoding method according to claim 3 wherein each said time interval corresponds to one clock cycle.

5. Encoding method according to claim 1 wherein each said parallel encoding unit comprising two or more coders arranged serially within each unit, wherein preselected coders of at least two encoding units are updated simultaneously in a first updating step, and updating of subsequent coders occurs sequentially in a second step and, if applicable, subsequent further steps.

6. Encoding method according to claim 5 using Widmer-Franaszek 8B/10B coding by interleaving 6-bit and 4-bit code bytes to form a 10-bit output code word.

7. Encoder for encoding k-bit data bytes into m-symbol code words, having a plurality of parallel, interconnected encoding units, each including at least one finite-state coder with at least two states, wherein each coder's next state is determined by a state transition function $z(n+1)=g(x(n),z(n))$, in which $x(n)$ is the current input data byte and $z(n)$ the current state of the coder, and each coder's output is determined by an output function $y(n)=h(x(n),z(n))$, in which $y(n)$ is the current output code work, characterized by means for preprocessing for at least two of the coders, in a time interval prior to the current time interval, the variables p(n) of the state transition function of said at least two coders according to $z(n+1)=g(x(n),z(n))=p(n)\odot z(n)$, wherein the variable $p(n)=f(x(n))$ solely depends on the input x(n) and the operation denoted by the algebraic operator "$\odot$" is associative.

means for algebraically combining said preprocessed variables p(n) of said at least two coders, and means for simultaneously updating the states of at least two parallel coders.

8. Encoder according to claim 7, wherein all said encoding units are identical to each other.

9. Encoder according to claim 7 or 8, wherein two or more groups of coders are arranged in parallel across said encoding units.

10. Encoder according to claim 9 wherein each of at least tow of said parallel encoding units comprising a plurality of coders, at least two of which coders are arranged in series within each unit, having means for updating preselected coders of said at least two encoding units simultaneously, and means for updating each subsequent coder in each said at least two encoding unit sequentially.

11. Encoder according to claim 9 wherein each of at least two of said parallel encoding units comprising a plurality of coders, at least two of which coders are arranged in series within each unit, having means for updating preselected coders of said at least two encoding units simultaneously, and means for simultaneously updating one or more of subsequent coders of said at least two parallel encoding units in sequence.

12. Encoder according to claim 8 equipped for the 8-bit/10-bit Widmer-Franaszek code, characterized in that N parallel, identical encoding units are provided, that each encoding unit comprises two coders in series, and that each unit is adapted to encode one 8-bit data byte into one 10-bit code word.

13. A method for encoding k-bit data bytes into m-symbol code words comprising the steps of:

interconnecting a plurality of parallel encoding units with each parallel encoding unit including at least one finite-state coder with at least two states, wherein each coder's next state is determined by a state transition function $z(n+1)=g(x(n),z(n))$, in which x(n) is the current input data byte and z(n) the current state of the coder and each coder's output is determined by an output function $y(n)=h(x(n),z(n))$, in which y(n) is the current output code word;

preprocessing for at least two of the coders, in a time interval prior to the current time interval, the variables p(n) of the state transition function of said at least two coders according to $z(n+1)=g(x(n),z(n))=p(n)\odot z(n)$, wherein the variable $p(n)=f(x(n))$ solely depends on the input x(n) and the operation denoted by the algebraic operator "$\odot$" is associative, algebraically combining said preprocessed variables p(n) of said at least two coders, and simultaneously updating the states of at least two parallel coders.

14. Encoder for encoding k-bit data bytes into m-symbol code words comprising:

a plurality of parallel, interconnected encoding units, each including at least one finite-state coder with at least two states, wherein each coder's next state is determined by a state transition function $z(n+1)=g(x(n),z(n))$, in which x(n) is the current input data byte and z(n) the current state of the coder and each coder's output is determined by an output function $y(n)=h(x(n),z(n))$, in which y(n) is the current output code word, means coupled to at least two of the coders for preprocessing in a time interval prior to the current time intervals, the variables p(n) of the state transition function of said at least two coders according to $z(n+1)=g(x(n),z(n))=p(n)\odot z(n)$, wherein the variable $p(n)=f(x(n))$ solely depends on the input x(n) and the operation denoted by the algebraic operator "$\odot$" is associative, means for algebraically combining said preprocessed variables p(n) of said at least two coders, and means for simultaneously updating the states of at least two parallel coders.

15. A method for encoding k-bit data bytes into m-symbol code words of an encoder having a plurality of parallel, interconnected encoding units, each including at least one finite-state coder with at least two states, wherein each coder's next state is determined by a state transition function $z(n+1)=g(x(n),z(n))$, in which x(n) is the current input data byte and $z(n)$ the current state of the coder and each coder's output is determined by an output function $y(n)=h(x(n),z(n))$, in which $y(n)$ is the current output code word, said method comprising the steps of:

preprocessing for at least two of the coders, in a time interval prior to the current time interval, the variables $p(n)$ of the state transition function of said at least two coders according to $z(n+1)=g(x(n),z(n)) = p(n) \odot z(n)$, wherein the variable $p(n)=f(x(n))$ solely depends on the input $x(n)$ and the operation denoted by the algebraic operator "$\odot$" is associative, algebraically combining said preprocessed variables $p(n)$ of said at least two coders, and simultaneously updating the states of at least two parallel coders.

* * * * *